US012751046B2

United States Patent
(12) United States Patent
Yoon et al.

(10) Patent No.: US 12,751,046 B2
(45) Date of Patent: Sep. 29, 2026

(54) SEMICONDUCTOR DEVICE INCLUDING TWO-DIMENSIONAL MATERIAL AND METHOD OF MANUFACTURING THE SAME

(71) Applicant: Samsung Electronics Co., Ltd., Suwon-si (KR)

(72) Inventors: Duseop Yoon, Suwon-si (KR); Junyoung Kwon, Suwon-si (KR); Minsu Seol, Suwon-si (KR); Minseok Yoo, Suwon-si (KR); Kyung-Eun Byun, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 797 days.

(21) Appl. No.: 18/152,976

(22) Filed: Jan. 11, 2023

(65) Prior Publication Data

US 2024/0021683 A1 Jan. 18, 2024

(30) Foreign Application Priority Data

Jul. 13, 2022 (KR) ........................ 10-2022-0086543

(51) Int. Cl.
*H10D 30/67* (2025.01)
*H10B 12/00* (2023.01)
(Continued)

(52) U.S. Cl.
CPC ......... *H10D 30/6729* (2025.01); *H10D 64/01* (2025.01); *H10D 64/62* (2025.01);
(Continued)

(58) Field of Classification Search
CPC ............. H10D 30/6729; H10D 30/481; H10D 62/883; H10D 62/881; C23C 18/54
See application file for complete search history.

(56) References Cited

U.S. PATENT DOCUMENTS 3,354,362 A * 11/1967 Zuleeg .................. H10D 84/87 257/E29.313
9,735,233 B2 8/2017 Heo et al.
(Continued)

FOREIGN PATENT DOCUMENTS

KR 10-2016-0081102 A 7/2016
KR 10-1826052 B1 2/2018
(Continued)

OTHER PUBLICATIONS

Y. Shacham-Diamand et al., "30 years of electroless plating for semiconductor and polymer micro-systems," Microelectronic Engineering, vol. 132, Jan. 25, 2015, pp. 35-45.
(Continued)

*Primary Examiner* — Vincent Wall
(74) *Attorney, Agent, or Firm* — Harness, Dickey & Pierce, P.L.C.

(57) ABSTRACT

A semiconductor device may include a two-dimensional material layer, one or more metal islands on the two-dimensional material layer, and a metal layer covering the metal islands on the two-dimensional material layer. The semiconductor device may be manufactured by a method including forming metal islands on a two-dimensional material layer using a redox method and forming a metal layer covering the metal islands on the two-dimensional material layer.

16 Claims, 21 Drawing Sheets

(51) Int. Cl.

| | |
|---|---|
| ***H10B 53/30*** | (2023.01) |
| ***H10B 61/00*** | (2023.01) |
| ***H10B 63/00*** | (2023.01) |
| ***H10D 62/80*** | (2025.01) |
| ***H10D 64/01*** | (2025.01) |
| ***H10D 64/62*** | (2025.01) |

(52) U.S. Cl.

CPC .............. *H10B 12/31* (2023.02); *H10B 53/30* (2023.02); *H10B 61/22* (2023.02); *H10B 63/30* (2023.02); *H10D 62/80* (2025.01)

(56) References Cited

U.S. PATENT DOCUMENTS

| | | | | |
|---|---|---|---|---|
| 9,922,825 | B2 * | 3/2018 | Lee | H01L 21/02568 |
| 10,229,901 | B2 | 3/2019 | Shao et al. | |
| 10,269,975 | B2 * | 4/2019 | Park | H01L 21/467 |
| 10,283,629 | B2 | 5/2019 | Engel et al. | |
| 10,573,774 | B2 * | 2/2020 | Park | H10F 71/138 |
| 12,211,930 | B2 * | 1/2025 | Chen | H01L 25/0657 |
| 12,366,617 | B2 * | 7/2025 | Shi | H10D 30/47 |
| 2008/0318394 | A1 * | 12/2008 | Kakehata | H01L 21/76254 257/E21.211 |
| 2013/0285012 | A1 * | 10/2013 | Lee | H10H 20/832 438/47 |
| 2016/0141427 | A1 * | 5/2016 | Chen | H10D 30/675 257/349 |
| 2016/0190244 | A1 | 6/2016 | Lee et al. | |
| 2018/0068851 | A1 * | 3/2018 | Lin | H01L 21/0262 |
| 2020/0091274 | A1 * | 3/2020 | Sharma | H10D 64/689 |
| 2020/0098880 | A1 * | 3/2020 | Sharma | H10D 64/64 |
| 2020/0358873 | A1 | 11/2020 | Peng et al. | |
| 2021/0234028 | A1 * | 7/2021 | Detzel | H10D 62/343 |
| 2021/0359099 | A1 * | 11/2021 | Shen | B82Y 10/00 |
| 2021/0408375 | A1 * | 12/2021 | Dorow | H10D 30/014 |
| 2022/0246737 | A1 * | 8/2022 | Loghmany | H10D 30/475 |
| 2022/0246766 | A1 * | 8/2022 | Manfrini | H10B 51/30 |
| 2023/0096121 | A1 * | 3/2023 | Jung | H01L 21/0262 257/499 |
| 2024/0021679 | A1 * | 1/2024 | Seol | H10D 30/675 |
| 2024/0021683 | A1 * | 1/2024 | Yoon | H10D 64/62 |
| 2024/0047528 | A1 * | 2/2024 | Seol | H10D 62/292 |
| 2024/0113117 | A1 * | 4/2024 | Sung | H10D 88/00 |
| 2024/0234492 | A1 * | 7/2024 | Kim | H10D 84/811 |
| 2025/0006840 | A1 * | 1/2025 | Steinhardt | H10D 30/6739 |
| 2025/0107147 | A1 * | 3/2025 | Kavrik | H10D 62/80 |
| 2025/0112122 | A1 * | 4/2025 | O'Brien | H01L 23/5286 |

FOREIGN PATENT DOCUMENTS

| | | |
|---|---|---|
| KR | 10-2232755 B1 | 3/2021 |
| KR | 10-2335772 B1 | 12/2021 |

OTHER PUBLICATIONS

Yue Zheng et al., "Ohmic Contact Engineering for Two-Dimensional Materials," Cell Reports Physical Science 2, 100298, Jan. 20, 2021.

Yuan Liu et al., "Approaching the Schottky-Mott limit in van der Waals metal-semiconductor junctions," Nature 557, 2018.

* cited by examiner

SEMICONDUCTOR DEVICE INCLUDING TWO-DIMENSIONAL MATERIAL AND METHOD OF MANUFACTURING THE SAME

CROSS-REFERENCE TO RELATED APPLICATION

This application is based on and claims priority under 35 U.S.C. § 119 to Korean Patent Application No. 10-2022-0086543, filed on Jul. 13, 2022 in the Korean Intellectual Property Office, the disclosure of which is incorporated by reference herein in its entirety.

BACKGROUND

1. Field

The present disclosure relates to semiconductor devices including a two-dimensional (2D) material and methods of manufacturing the semiconductor devices.

2. Description of the Related Art

Silicon is generally used as a channel layer of a transistor. When an electrode is formed in silicon, contact resistance may be reduced by forming the electrode after overdoping a region close to a source electrode and a drain electrode in silicon. However, because silicon may not be formed to be thin while maintaining the crystallinity thereof, there may be a limitation in scaling.

For scaling a semiconductor device, research is being conducted to utilize a 2D material, which is as thin as atomic layer units and maintains crystallinity, as a channel layer instead of silicon. However, because doping the 2D material may be difficult, it may be difficult to make good contact.

SUMMARY

Provided are semiconductor devices including a two-dimensional (2D) material having small surface defect and methods of manufacturing the semiconductor devices.

Provided are methods of manufacturing a metal layer on a 2D material layer without providing external power source or heat.

Additional aspects will be set forth in part in the description which follows and, in part, will be apparent from the description, or may be learned by practice of the presented embodiments of the disclosure.

According to an example embodiment, a semiconductor device may include one or more metal islands on the 2D material layer, and a metal layer covering the metal island on the 2D material layer.

In some embodiments, the metal layer may be in contact with the 2D material layer while covering the metal islands.

In some embodiments, a thickness of the metal layer may be greater than a thickness of the metal islands.

In some embodiments, a thickness of the metal layer may be three or more times greater than a thickness of the metal islands.

In some embodiments, the metal islands and the metal layer may include different metals from each other.

In some embodiments, a metal included in at least one of the metal islands and the metal layer may include a transition metal.

In some embodiments, the metal island may include at least one of palladium, platinum, gold, silver, iridium, osmium, ruthenium, and rhodium.

In some embodiments, the metal layer may include at least one of gold, silver, copper, platinum, palladium, nickel, chromium, and cobalt.

In some embodiments, the metal layer may further include at least one of a non-metal material and a semi-metal.

In some embodiments, a ratio of the non-metal or the semi-metal with respect to the metal layer may be greater than 0 at % and less than or equal to 25 at %.

In some embodiments, the metal layer may further include at least one of boron and phosphorus.

In some embodiments, the 2D material layer may include transition metal dichalcogenide (TMD).

In some embodiments, the TMD may include a metal element and a chalcogen element. The metal element may include one of Mo, W, Nb, V, Ta, Ti, Zr, Hf, Tc, Re, Cu, Ga, In, Sn, Ge and Pb. The chalcogen element may include one of S, Se and Te.

In some embodiments, a transistor may include the semiconductor device. The 2D material layer may be a channel layer of the transistor, and the metal islands and the metal layer may be a source electrode or a drain electrode of the transistor.

According to an example embodiment, a method of manufacturing a semiconductor device may include preparing a 2D material layer; forming metal islands on the 2D material layer using a redox method; and forming a metal layer covering the metal islands on the 2D material layer.

In some embodiments, the metal layer may be formed using a redox process.

In some embodiments, the forming the metal layer may include precipitating a first metal on the 2D material layer using the redox process, and forming a metal layer including a second metal by substituting the first metal with the second metal.

In some embodiments, the metal islands and the metal layer may include different metals from each other.

In some embodiments, the metal island may include at least one of palladium, platinum, gold, silver, iridium, osmium, ruthenium, and rhodium.

In some embodiments, the metal island may include palladium.

In some embodiments, the metal layer may include at least one of gold, silver, copper, platinum, palladium, nickel, chromium, and cobalt.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
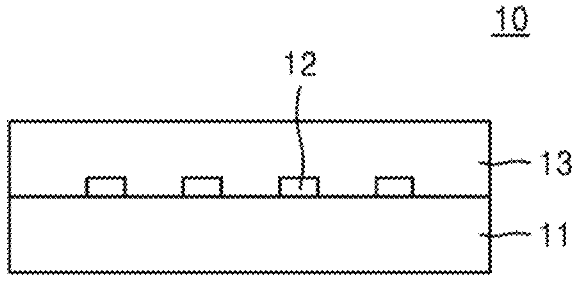
FIG. 1 is a diagram showing a thin film structure according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Reference will now be made in detail to embodiments, examples of which are illustrated in the accompanying drawings. In the drawings, like reference numerals refer to like elements throughout, and sizes of elements may be exaggerated for clarity and convenience of explanation. The following embodiments described below are merely illustrative, and various modifications may be possible from the embodiments of the present disclosure.

When an element or layer is referred to as being "on" or "above" another element or layer, the element or layer may be directly on another element or layer or intervening elements or layers. The singular forms "a," "an" and "the" are intended to include the plural forms as well, unless the context clearly indicates otherwise. When a part "comprises" or "includes" an element in the specification, unless otherwise defined, it is not excluding other elements but may further include other elements.

The term "above" and similar directional terms may be applied to both singular and plural. With respect to operations that constitute a method, the operations may be performed in any appropriate sequence unless the sequence of operations is clearly described or unless the context clearly indicates otherwise. The operations may not necessarily be performed in the order of sequence.

Also, in the specification, the term "units" or ". . . modules" denote units or modules that process at least one function or operation, and may be realized by hardware, software, or a combination of hardware and software.

Connections or connection members of lines between components shown in the drawings illustrate functional connections and/or physical or circuit connections, and the connections or connection members can be represented by replaceable or additional various functional connections, physical connections, or circuit connections in an actual apparatus.

All examples or example terms are simply used to explain in detail the technical scope of the inventive concept, and thus, the scope of the inventive concept is not limited by the examples or the example terms as long as it is not defined by the claims.

FIG. 1 is a diagram showing a thin film structure 10 according to an embodiment. Referring to FIG. 1, the thin film structure 10 may include a two-dimensional (2D) material layer 11, and one or more metal islands 12 disposed on the 2D material layer 11, and a metal layer 13 covering the metal islands 12 on the 2D material layer 11.

The 2D material refers to a material having a 2D crystal structure. The 2D material may have a monolayer structure or a multilayer structure. Each layer constituting the 2D material may have a thickness of an atomic level. The 2D material may include, for example, at least one of graphene, black phosphorous, and transition metal dichalcogenide (TMD).

Graphene is a material having a hexagonal honeycomb structure in which carbon atoms are two-dimensionally bonded, and, compared to silicon (Si), has high electrical mobility and high thermal properties, is chemically stable, and has a large surface area. In addition, black phosphorus is a substance in which black phosphorous atoms are two-dimensionally bonded.

TMD may include, for example, one transition metal among Mo, W, Nb, V, Ta, Ti, Zr, Hf, Tc, and Re and one chalcogen element among S, Se, and Te. TMD may be expressed, for example, as $MX_2$, where M represents a transition metal and X represents a chalcogen element. For example, M may be Mo, W, Nb, V, Ta, Ti, Zr, Hf, Tc, Re, or the like, and X may be S, Se, Te, or the like. Thus, for example, the TMD may include $MoS_2$, $MoSe_2$, $MoTe_2$, $W_{52}$, $WSe_2$, $WTe_2$, $ZrS_2$, $ZrSe_2$, $HfS_2$, $HfSe_2$, $NbSe_2$, $ReSe_2$, and the like. Alternatively, the TMD may not be represented by $MX_2$. In this case, for example, TMD may include CuS, which is a compound of Cu as a transition metal and S as a chalcogen element. Meanwhile, the TMD may be a chalcogenide material including a non-transition metal. The non-transition metal may include, for example, Ga, In, Sn, Ge, Pb, or the like. In this case, the TMD may include a compound of a non-transition metal, such as Ga, In, Sn, Ge, and Pb and a chalcogen element, such as S, Se, and Te. For example, the TMD may include $SnSe_2$, GaS, GaSe, GaTe, GeSe, $In_2Se_3$, $InSnS_2$, and the like.

As described above, TMD may include one of a metal element of Mo, W, Nb, V, Ta, Ti, Zr, Hf, Tc, Re, Cu, Ga, In, Sn, Ge, and Pb and one of a chalcogen element of S, Se, and Te. However, the materials mentioned above are merely examples, and other materials may be used as the TMD material.

One or more metal islands 12 may be disposed on the 2D material layer 11. The metal islands 12 may be disposed on a portion of a surface of the 2D material layer 11. The metal islands 12 may be metal particles to which one or more metal atoms are bonded. When there are a plurality of metal islands 12, at least two of the plurality of metal islands 12 may be separated from each other on the surface of the 2D material layer 11 to expose the surface of the 2D material layer 11. Thus, the metal layer 13 may be in direct contact with the 2D material layer 11 to facilitate charge transfer between the 2D material layer 11 and the metal layer 13.

The metal islands 12 serve as a catalyst layer for forming the metal layer 13, and may be less amount than the metal layer 13. The content of the metal islands 12 with respect to the metal layer 13 may be greater than about 0 at %, 0.01 at % or more, 0.1 at % or more, or 1 at % or more. In addition, the content of the metal islands 12 with respect to the metal layer 13 may be 5 at % or less, 10 at % or less, or 15 at % or less.

The metal islands 12 may be formed on the 2D material layer 11 using a redox reaction. The catalyst layer may have a thickness of about 10 nm or less. The metal islands 12 may include a noble metal, such as palladium, platinum, gold, silver, iridium, osmium, ruthenium, rhodium, etc.

The metal layer 13 may further be disposed on the 2D material layer 11. The metal layer 13 may directly contact the 2D material layer 11 while covering the metal island 12. An average thickness of the metal layer 13 may be greater than a thickness of the metal islands 12. For example, the average thickness of the metal layer 13 may be three or more times that of the metal islands 12. The metal layer 13 may have a thickness of about 15 nm or more.

The metal layer 13 may include a transition metal, such as gold, silver, copper, platinum, palladium, nickel, chromium, or cobalt.

In order to form the metal layer 13 without damaging the 2D material layer 11, it may be necessary to suppress a Fermi level pinning phenomenon while the electron affinity of the 2D material layer 11 and the work function of the metal layer 13 are similar. In order to eliminate a metal induced gap state (MIGS) generated between the metal layer 13 and the 2D material layer 11, the metal layer 13 may further include a semi-metal having a significantly lower density of states (DOS). For example, the metal layer 13 may further include boron (B), bismuth (Bi), antimony (Sb), or the like.

The metal layer 13 may be formed on the 2D material layer 11 by using an oxidative reduction reaction. The metal layer 13 may further include a material of a plating solution (e.g., a reducing agent) used in a manufacturing process of the metal layer 13. For example, the metal layer 13 may further include a non-metal (e.g., phosphorus (P)) or a semi-metal (e.g., boron (B)). The content of the non-metal or semi-metal in the metal layer 13 may be greater than 0 at % or greater than 5 at %. Because the content of the non-metal or semi-metal may affect electrical properties between the 2D material layer 11 and the metal layer 13, the content of the non-metal or semi-metal in the metal layer 13 may be about 25 at % or less.

A sputtering or an evaporation process may be used as a method of forming the metal layer 13 on the 2D material layer 11. In the case of sputtering, high-energy metal atoms may collide with the 2D material layer 11. According to the collision, defects may be generated on a surface of the 2D material layer 11, and the change in a surface state may change physical properties of the 2D material layer 11. In particular, when the 2D material layer 11 and the metal layer 13 are used as a channel layer and an electrode of a transistor, if a chemical bond state between the 2D material layer 11 and the metal layer 13 is added, a Fermi level pinning phenomenon may occur, thus, a contact resistance between the 2D material layer 11 and the metal layer 13 may not be reduced to a certain level or greater.

In the case of an evaporation process, because a metal is deposited on the 2D material layer 11 after heating the metal to an evaporation temperature of the metal, defects may be generated in the 2D material layer 11 due to the thermal energy of the deposited metal atoms. In order to limit and/or minimize the defects, the metal layer 13 may include a metal having a low melting point. However, when a metal having a low melting point is used, the metal itself is highly likely to be damaged by heat of a subsequent process, so it is difficult to use the metal having a low melting point.

The metal layer 13 according to an embodiment may be formed on the 2D material layer 11 by using an electrochemical plating method. Because the metal layer 13 according to an embodiment is formed on the 2D material layer 11 by redox reaction without using an external power source, the change in physical properties of the 2D material layer 11 may be limited and/or minimized.

Figure 2:
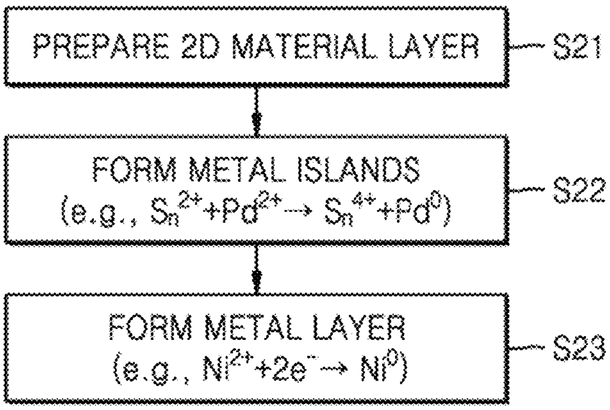
FIG. 2 is a diagram for explaining a method of forming a metal layer on a two-dimensional (2D) material layer, according to an embodiment.

FIG. 2 is a diagram for explaining a method of forming the metal layer 13 on a 2D material layer according to an embodiment.

The 2D material layer 11 is prepared (S21). The 2D material layer 11 may be prepared by growing a 2D material on a substrate SUB or by transferring the 2D material layer 11 onto the substrate SUB. The substrate SUB may include a Si wafer.

The metal islands 12 may be formed on the 2D material layer 11 by redox reaction (S22). In the case of plating on a surface of a metal material that is a conductive material, it may be desirable to have a surface of the metal material exhibit conductivity. However, because the 2D material layer 11 has semiconductor properties, it is difficult to directly plate a metal on the 2D material layer 11. The metal islands 12, which may act as a catalyst layer, may be formed on the 2D material layer 11 to selectively cause a redox reaction only on a surface of the 2D material layer 11. A metal material to be described later may be precipitated around the metal islands 12.

The metal islands 12 may include palladium (Pd). On the 2D material layer 11, a stannous chloride dihydrate ($SnCl_2 \cdot 2H_2O$) aqueous chloride solution may be provided. The stannous chloride dihydrate may be adsorbed to a surface of the 2D material layer 11. In addition, an aqueous solution of palladium chloride ($PdCl_2$) hydrochloric acid may be provided on the 2D material layer 11 to which stannous chloride dihydrate is adsorbed.

A standard redox potential of $Sn^{4+}/Sn^{2+}$ is 0.15V, which is lower than the standard redox potential of $Pd^{2+}/Pd^0$, 0.987V. As shown in Formula 1 below, an oxidation-reduction reaction for reducing $Pd^{2+}$ occurs as $Sn^{2+}$ is oxidized, and thus, $Pd^0$ serving as a catalyst may be adsorbed on the 2D material layer 11.

Formula 1

$$Sn^{2+} + Pd^{2} \rightarrow Sn^{4+} + Pd^{0}$$

Precipitated palladium particles may be referred to as the metal islands 12.

For electroless plating on the 2D material layer 11, which is a semiconductor, a condition in which redox reaction occurs without applying an electric current may be required. In order to induce a smooth redox reaction on the 2D material layer 11, a process of surface activation by a catalyst may be required.

For the method of adsorbing Sn and Pd to the surface of the 2D material layer 11, a sensitization treatment using $SnCl_2$ and an activation treatment using $PdCl_2$ may be continuously performed. However, the present embodiment is not limited thereto. On the other hand, it is possible to treat the sensitization treatment and the activation treatment at once by using a colloidal solution in which $SnCl_2$ and $PdCl_2$ are mixed. For example, the surface of the 2D material layer 11 may be sensitized for 20 minutes in a solution consisting of 0.045M stannous chloride dihydrate ($SnCl_2 \cdot 2H_2O$) and 10 mL hydrochloric acid (HCl). Then, the metal islands 12 may be formed on the 2D material layer 11 by performing an activation treatment in 0.5 mM palladium chloride ($PdCl_2$) and 5 mL hydrochloric acid (HCl) solution for 5 minutes.

In operation of forming the metal islands 12, in addition to the method in which tin ions ($Sn^{2+}$) directly reduce palladium ions ($Pd^{2+}$), a process in which tin ions ($Sn^{2+}$) reduce silver (Ag) and palladium (Pd) is adsorbed by substitution of silver (Ag) may also be possible.

The metal layer 13 may be formed on the 2D material layer 11 by a redox reaction (S23). The plating solution may include a metal salt including metal ions and a reducing agent.

The metal salt may be a salt including metal ions to be precipitated. In the case of nickel plating, the metal salt may include nickel chloride ($NiCl_2 \cdot 6H_2O$) and nickel sulfate ($NiSO_4 \cdot 6H_2O$).

The reducing agent may be a material for reducing the metal on the 2D material layer 11 by supplying electrons to the metal ions. For example, the reducing agent for nickel plating may include sodium hypophosphite ($NaH_2PO_2 \cdot H_2O$), a borohydride compound, hydrazine ($N_2H_4$), and the like.

When the reducing agent included in the plating solution is oxidized, as shown in Chemical Formula 2, metal ions may receive electrons emitted from the reducing agent to precipitate metal on the 2D material layer 11.

Formula 2

$$\text{Oxidation reaction: } R + H_2O \rightarrow OX + 2H^+ + 2e^-$$

$$\text{Reduction reaction: } M^{2+} + 2e \rightarrow M^0$$

Here, R is a reducing agent, OX is an oxide of the reducing agent, $M^{2+}$ is a metal ion, and $M^0$ is a reduced metal.

For example, when the metal layer 13 including nickel is to be formed, the electroless plating solution may include 0.1M nickel salt ($NiSO_4 \cdot 6H_2O$) as a main component and 0.2M sodium hypophosphite ($NaH_2PO_3 \cdot H_2O$) as a reducing agent.

In the plating solution, nickel may be precipitated during oxidation-reduction reaction as shown in Chemical Formula 3 below. As nickel is deposited around the metal islands 12 as a catalyst layer, it may be in contact with the 2D material layer 11 while covering the metal islands 12.

Formula 3

$$\text{Oxidation reaction: } H_2PO_{2-} + H_2O \rightarrow H_2PO_{3-} + 2H+ + 2e-$$

$$\text{Reduction reaction: } Ni^{+2} + 2e^- \rightarrow Ni^0 \Rightarrow$$

$$Ni^{+2} + H_2PO_2- + H_20 \rightarrow Ni^0 + H_2PO_3- + 2H^+$$

The plating solution may further include a complexing agent, a pH control agent, a stabilizer, and the like as auxiliary components.

The complexing agent may include an organic acid or an organic salt to form a complex ion, and the complexing agent is added to the plating solution to confine free metal ions, and thus, may control a plating rate, and may also act as a buffer for limiting and/or preventing sudden pH change of the plating solution due to hydrogen ions generated during plating.

The complexing agent also increases the solubility of orthophosphite generated during plating and delays the precipitation of nickel phosphite, thereby limiting and/or preventing spontaneous decomposition of the plating solution and increasing stability of plating. Tetrasodium Diphosphate ($Na_4P_2O_7 \cdot 10H_2O$), etc. may be used as a complexing agent for nickel plating.

The pH control agent may include caustic soda, ammonium hydroxide, inorganic acid, organic acid, etc., and controls the plating speed, reduction efficiency, stability, and the like. For example, the pH of the plating solution may be controlled with an aqueous ammonia ($NH_4OH$) solution, and the nickel plating may maintain a pH in a range from about 10 to about 11.

The stabilizer serves to limit and/or prevent spontaneous decomposition of the electroless plating solution. The spontaneous decomposition in the electroless plating may indicate that a rapid decomposition of the solution due to metal ions that cause a metal precipitation reaction not only on surfaces of a catalyst but on all surfaces in contact with the solution and on surfaces of colloidal particles in the solution. One of the many causes of spontaneous decomposition may be colloidal particles, such as foreign substances in solution or precipitates of reaction products, and surfaces of these particles act as a nucleus on which a metal is deposited. The stabilizers may mainly include chlorides of lead, sulfides, nitrides, thiourea, and the like. As a stabilizer, thiourea ($H_2NCSNH_2$), which is a sulfide, may further be included.

On the other hand, during an electroless plating, while a reducing agent donates electrons to metal ions, the metal ions are reduced and the metal is precipitated, and as shown in Formula 4 below, a non-metal (e.g., P) included in the reducing agent may also be adsorbed to the metal layer 13 at the same time.

Formula 4

$$Ni^{2+} + 4H_2PO_2- + H_2O \rightarrow Ni^0 + 2P + 2H_2PO_3- + 2H_2O$$

When a semi-metal is included in the reducing agent, the semi-metal (e.g., B) included in the reducing agent may also be adsorbed to the metal layer 13 at the same time.

Formula 5

$$3Ni^{2+} + 3(CH_3)_2NH{\bullet}oBH_3 + 6H_2O \rightarrow 3Ni^0 + B + 3(CH_3)_2NH_2^+ + 2H_3BO_3 + 9/2H_2 + 3H^+$$

Washing and drying processes may be performed for each process to limit and/or prevent foreign substances from being included in the metal layer 13. Deionized water may be used as a washing solution, and a spin drying process may be used for drying.

It is also possible to form the metal layer 13 by using a substitution plating method, in which a difference in ionization tendency is used, together with the redox reaction method. The substitution plating may use in a difference in ionization tendency between metals. For example, when a solution including gold ions ($Au^{2+}$) is provided on the 2D material layer 11 coated with nickel ($Ni^0$), gold ($Au^0$) may be precipitated by a reaction as shown in Formula 6 below.

Formula 6

$$Ni^0 + Au^{2+} \rightarrow Ni^{2+} + Au^0$$

As described above, when the redox method and the substitution method are used, various metals, such as gold, silver, copper, platinum, palladium, nickel, chromium, cobalt, and tin may be formed on the 2D material layer 11.

By forming a metal island layer, which is a catalyst layer, before forming the metal layer 13 on the 2D material layer 11, the metal layer 13 with improved uniformity may be formed. When the metal layer 13 is formed using a redox reaction without a catalyst layer, because the 2D material layer 11 has semiconductor properties, it is difficult to form the metal layer 13 in direct contact with the 2D material layer 11. In addition, when the metal layer 13 is formed, if the metal layer 13 is formed by including a catalyst in the plating solution, because the metal is intensively precipitated in the vicinity of the catalyst in the plating solution, it may be difficult to form a uniform metal layer 13 on a surface of the 2D material layer 11. The metal layer 13 according to an embodiment is formed after performing the formation, washing, and drying processes of the metal islands 12, and thus, may have a uniform thickness.

FIGS. 3A to 3E are diagrams for explaining a method of forming a metal layer 13 on a 2D material layer 11 by using a damascene process according to an embodiment.

Figure 3A:
FIGS. 3A to 3E are diagrams for explaining a method of forming a metal layer on a 2D material layer by using a damascene process, according to an embodiment.

Referring to FIG. 3A, the 2D material layer 11 is prepared. The 2D material layer 11 may be deposited on a substrate SUB or transferred onto the substrate SUB.

Figure 3B:
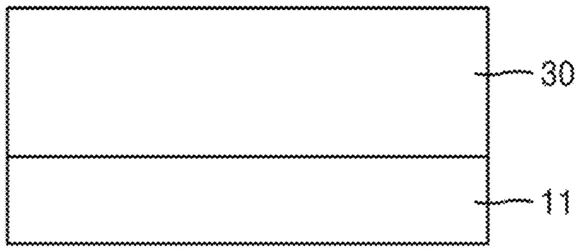

Referring to FIG. 3B, an oxide layer 30 may be formed on the 2D material layer 11. The oxide layer 30 may include silicon oxide. The oxide layer 30 may be formed by various methods, such as plating, evaporation, sputtering, chemical vapor deposition (CVD), and atomic layer deposition (ALD). The oxide layer 30 may be formed at a temperature of less than 300° C. so as not to damage the 2D material layer 11.

Figure 3C:
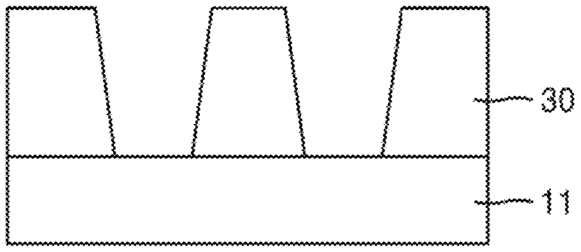

Referring to FIG. 3C, the oxide layer 30 may be etched to expose the 2D material layer 11. The oxide layer 30 may be etched by using a photolithography process.

Figure 3D:
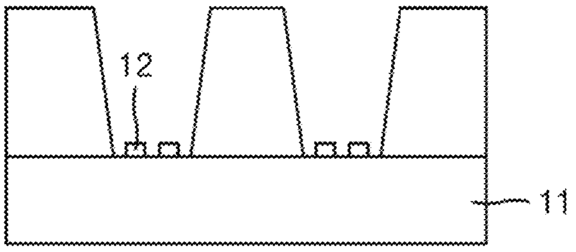

Referring to FIG. 3D, metal islands 12 may be formed on the 2D material layer 11. The metal islands 12 may be formed using a redox reaction, which is described above, and thus, a detailed description thereof is omitted.

Figure 3E:
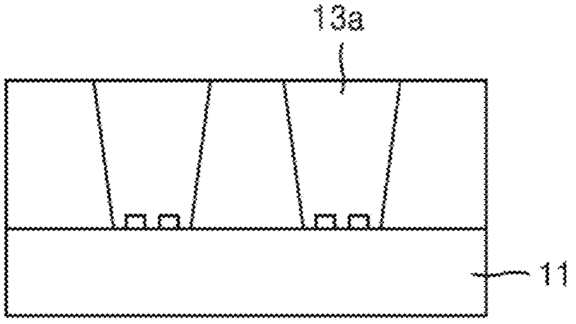

Referring to FIG. 3E, a metal layer 13*a* may be formed on the 2D material layer 11 to cover the metal islands 12. The metal layer 13*a* may be formed using a redox reaction as described above, and thus, a detailed description thereof is omitted.

A fine patterning of the metal layer 13*a* is possible using a damascene process. In addition, because the 2D material layer 11 having a sensitive surface state is sealed by the oxide layer 30, and thus, is not exposed to the outside during the forming process of the metal layer 13, an optimum performance of the 2D material layer 11 may be maintained.

Figure 4A:
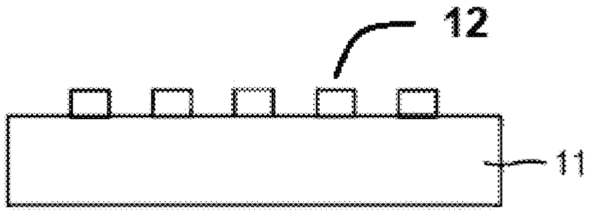
FIGS. 4A to 4C are diagrams for explaining a method of patterning a metal layer on a 2D material layer by using an etching process, according to an embodiment.
Figure 4B:
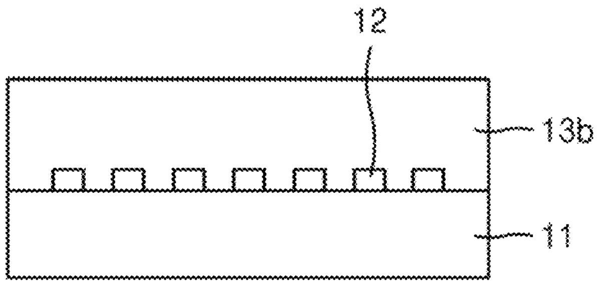
Figure 4C:
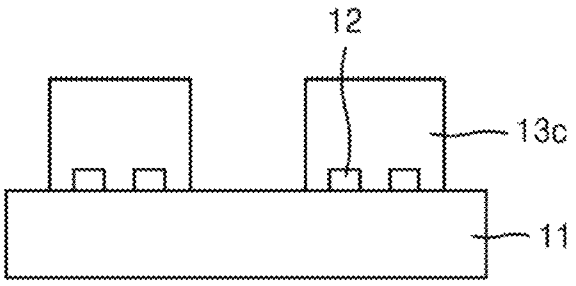

FIGS. 4A to 4C are diagrams for explaining a method of patterning a metal layer on a 2D material layer by using an etching process according to an embodiment.

Referring to FIG. 4A, metal islands 12 may be formed on the 2D material layer 11. The metal islands 12 may be formed using a redox reaction as described above, and thus, a detailed description thereof is omitted.

Referring to FIG. 4B, a metal layer 13*b* may be formed on the 2D material layer 11 to cover the metal islands 12. The metal layer 13*b* may be formed using a redox reaction as described above, and thus, a detailed description thereof is omitted.

Referring to FIG. 4C, the metal layer 13*b* may be patterned. After the metal layer 13 is etched by using a lithography process, the remaining metal layer 13*b* may be wet-etched. For wet etching, for example, a metal etchant, such as $FeCl_3$ or $HNO_3$ may be used. Because the metal etchant may not etch the 2D material layer 11, the 2D material layer 11 may serve as an etching stop layer.

The etching process may be used to simply pattern the metal layer 13 on the 2D material layer 11 in a micro-scale device. Because the above etching process is simpler than the damascene process, it may be used in low-cost processes.

Hereinafter, Embodiment and Comparative Example are described below. The Embodiment which is described below is only an example and is not limited thereto.

Embodiment

A 2D material layer 11 of $MoS_2$ was transferred onto a silicon wafer. In order to form palladium particles, which are metal islands 12, on a surface of the 2D material layer 11, a surface of the 2D material layer was sensitized for 20 minutes in a solution including 0.045M stannous chloride dihydrate ($SnCl_2$. $H_2O$) and 10 mL hydrochloric acid (HCl), and afterwards, activation treatment was performed for 5 minutes in a solution including 0.5 mM palladium chloride ($PdCl_2$) and 5 mL hydrochloric acid (HCl) to form a metal islands 12 of Pd. In addition, a plating was performed with an electroless plating solution including 0.1M nickel sulfate (0.1M-$NiSO_4{\cdot}6H_2O$) as a nickel salt, 0.2M sodium hypophosphite ($NaH_2PO_3{\cdot}H_2O$) as a reducing agent, and 0.1M tetrasodium pyrophosphate ($Na_4P_2O_7{\cdot}10H_2O$) as a complexing agent for nickel precipitation and liquid stability. The pH of the plating solution was adjusted with an aqueous ammonia ($NH_4OH$) solution to maintain a pH of 10 to pH 11, and 0 to 4 ppm of thiourea ($H_2NCSNH_2$), which is a sulfide, was added as a stabilizer. As a result of electroless plating at 65° C. for 1 minute, a nickel layer having a thickness of 110 nm was obtained.

Comparative Example

A 2D material layer of $MoS_2$ was transferred onto a silicon wafer. A nickel layer was formed on the 2D material layer by an electron beam deposition process.

Figure 5A:
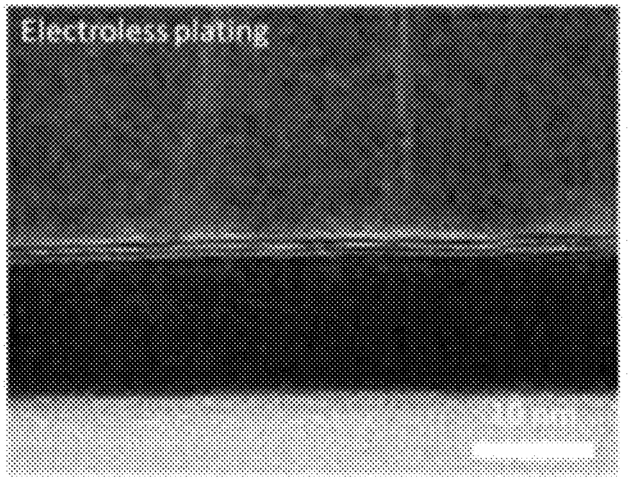
FIG. 5A is a diagram illustrating a transmission electron microscope (TEM) image of an interface between a 2D material layer and a metal layer, according to an embodiment.
Figure 5B:
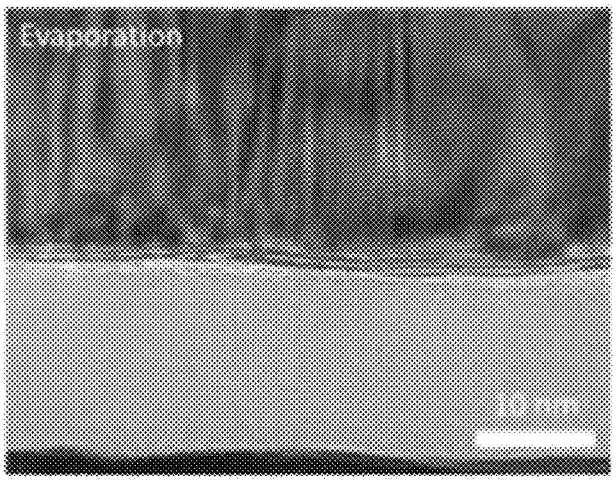
FIG. 5B is a diagram showing a TEM image of an interface between a metal layer and a 2D material layer formed by using an electron beam deposition process as a comparative example.

FIG. 5A is a diagram showing a transmission electron microscope (TEM) image of an interface between a 2D material layer and a metal layer according to an embodiment, and FIG. 5B is a diagram showing a TEM image of an interface between a metal layer and a 2D material layer formed by using an electron beam deposition process as a comparative example.

Referring to FIG. 5A, it may be seen that the interface between the 2D material layer and the metal layer is clear and a separation distance at the interface is constant. It may be expected that a material exchange between the 2D material layer and the metal layer is hardly performed. On the other hand, referring to FIG. 5B, it may be confirmed that a distance between the 2D material layer and the metal layer is not clear, and even a metal material of the metal layer penetrates into the 2D material layer. It may be expected that the physical properties of the 2D material layer are changed due to chemical bonding between the 2D material layer and the metal material of the metal layer.

In order to measure a surface state of the 2D material layer, a metal layer including metal islands and nickel formed on the 2D material layer of $MoS_2$ according to an embodiment was etched. In Comparative Example 1, the 2D material layer including $MoS_2$ was not treated at all. In Comparative Example 2, a metal layer formed by an electron beam deposition process on the 2D material layer including $MoS_2$ was etched. Then, surface states of the 2D material layer according to Embodiment, Comparative Examples 1, and Comparative Examples 2 were measured.

Figure 6A:
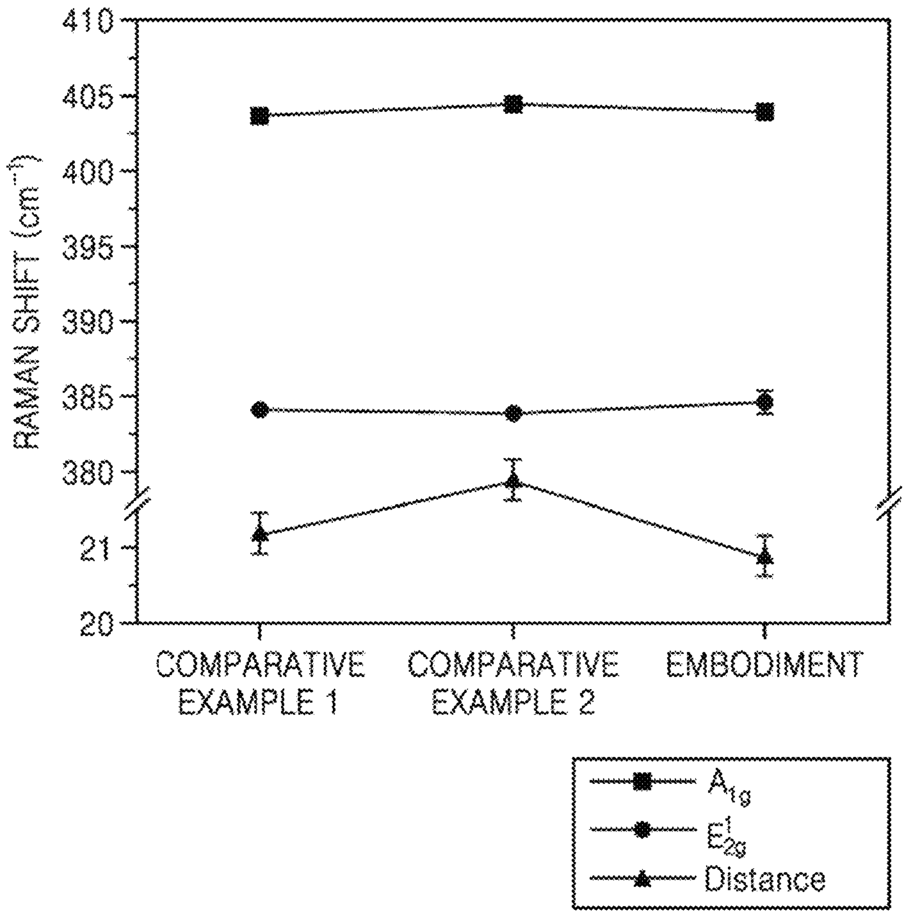
FIG. 6A is a graph showing a result of a Raman shift between peak A and peak E according to Raman analysis of a 2D material layer according to an embodiment.

FIG. 6A is a graph showing a result of Raman shift between peak A and peak E according to Raman analysis of a 2D material layer according to an embodiment. Referring to FIG. 6A, it may be seen that a distance between the peak A and the peak E of Comparative Example 2 is relatively increased compared to those of Comparative Example 1 and Embodiment. The distance between the peak A and the peak E increases as the number of defects in the 2D material layer increases. It may be expected that more defects exist in the 2D material layer of Comparative Example 2 than in Embodiment and Comparative Example 1. The distance between the peak A and the peak E of Embodiment is almost the same as the distance between the peak A and the peak E of Comparative Example 1. It may be expected that the physical properties of the 2D material layer according to Embodiment are similar to those of the 2D material layer in which the metal layer is not formed.

Figure 6B:
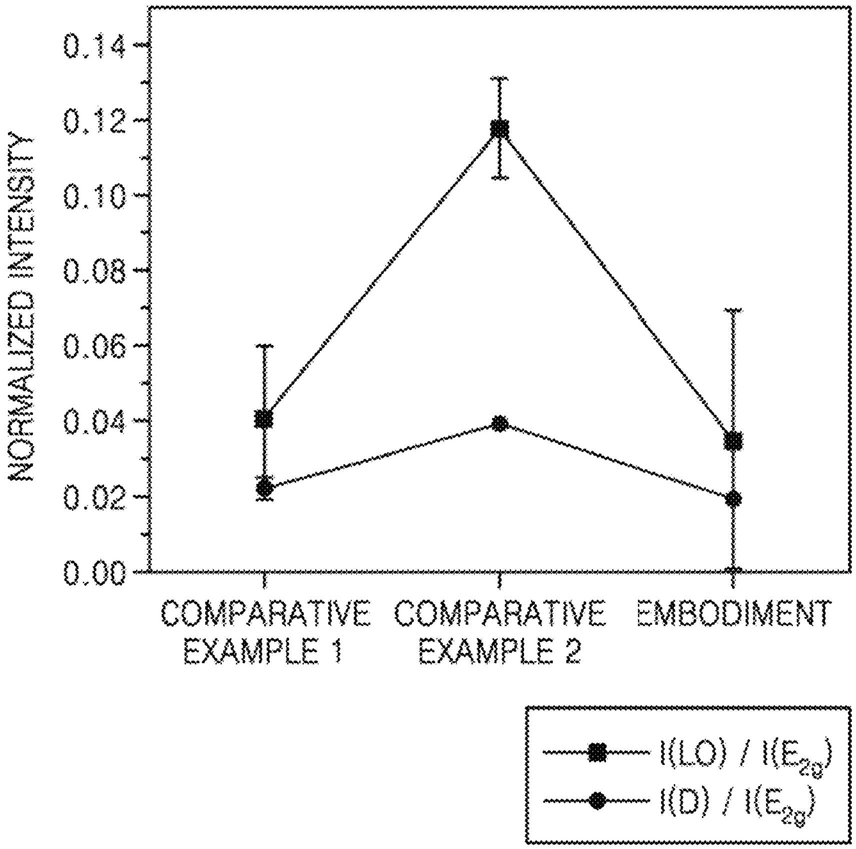
FIG. 6B is a graph showing intensities of a peak LO and a peak D according to Raman analysis of a 2D material layer according to an embodiment.

FIG. 6B is a graph showing intensities of a peak LO and a peak D according to Raman analysis of a 2D material layer according to an embodiment. Referring to FIG. 6*b*, it may be seen that the intensities of the peak LO and the peak D according to Comparative Example 2 are relatively increased compared to those of Comparative Example 1 and Embodiment. Because the peak LO and the peak D are peaks present when there are many defect sites, it may be confirmed that there are many defects on the 2D material layer according to Comparative Example 2. The intensities of the peak LO and the peak D according to Embodiment are similar to those of the peak LO and the peak D according to Comparative Example 1. It may be expected that the physical properties of the 2D material layer according to Embodiment are similar to those of the 2D material layer in which the metal layer is not formed.

Figure 7:
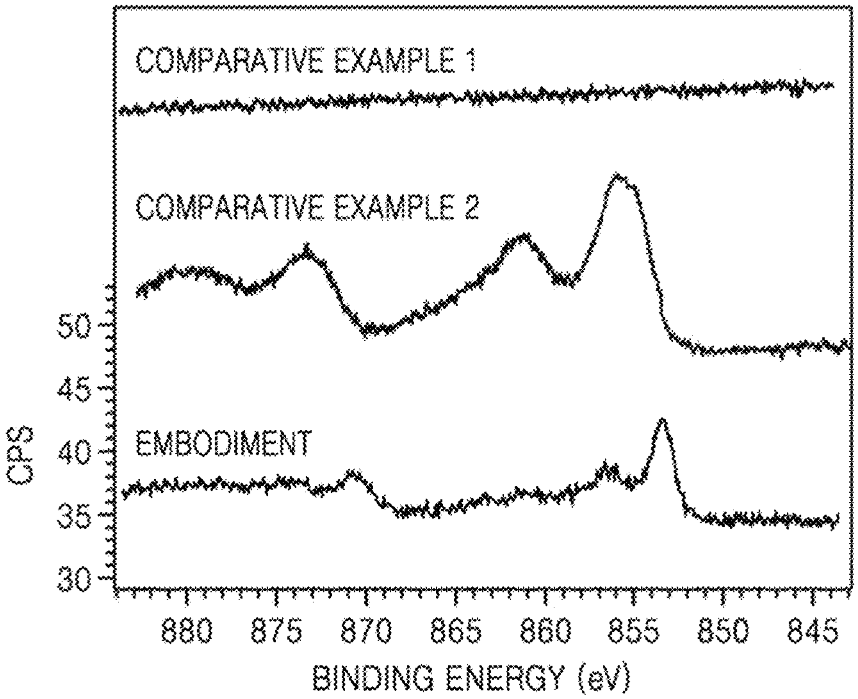
FIG. 7 is a graph showing a result of analyzing 2p of Ni by X-ray photoemission spectroscopy (XPS) to confirm that nickel remains on a surface of a 2D material layer.

FIG. 7 is a graph showing a result of analyzing 2p of Ni by X-ray photoemission spectroscopy (XPS) to confirm that nickel remains on a surface of the 2D material layer. Referring to FIG. 7, it may be confirmed that nickel was detected in Embodiment and Comparative Example 2. It may be seen that the amount of nickel detected in Embodiment is much less than the amount of nickel detected in Comparative Example 2. When the metal layer is formed by using the electron beam vapor deposition method, more defects may be generated on the surface of the 2D material layer, and $MoS_2$ and Ni may be chemically combined. Thus, Ni atoms may remain on the 2D material layer after etching the metal layer. On the other hand, in the formation of the metal layer by a redox reaction according to an embodiment, it may be expected that $MoS_2$ and Ni have less chemical combining.

In the method of forming a metal layer on the 2D material layer according to an embodiment, because the metal layer is formed on the 2D material layer without a heating process, the occurrence of defects in the 2D material layer may be reduced.

The thin film structure 10 according to an embodiment may be a component of a semiconductor device. For example, when the semiconductor device is a transistor, the 2D material layer 11 may be a channel layer, and the metal islands 12 and the metal layer 13 may be a drain or source electrode.

Figure 8:
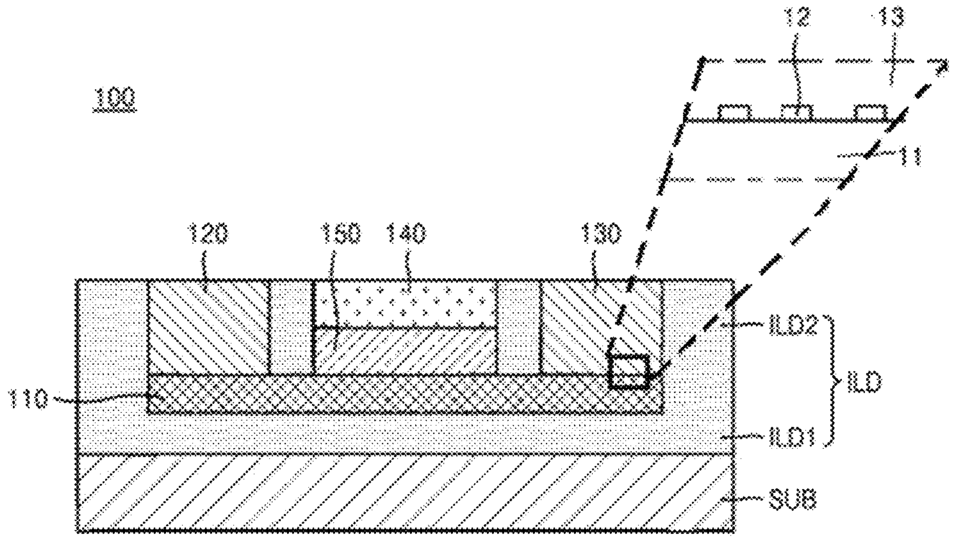
FIG. 8 is a diagram illustrating a semiconductor device including a 2D material layer according to an embodiment.

FIG. 8 is a diagram illustrating a semiconductor device 100 including a 2D material layer according to an embodiment. The semiconductor device may include a transistor. Referring to FIG. 8, the semiconductor device 100 may include a substrate SUB, a channel layer 110 disposed on the substrate SUB, a source electrode 120 and a drain electrode 130 disposed on the channel layer 110 and separated from each other, a gate electrode 140 that is separated from the channel layer 110, and a gate insulating layer 150 disposed between the channel layer 110 and the gate electrode 140.

The substrate SUB may be provided in a flat plate shape extending along one surface. The substrate SUB may be a material for forming a device, and may be selected from a material having high mechanical strength or dimensional stability. The material of the substrate SUB may include a glass plate, a metal plate, a ceramic plate, or a plastic (e.g., polycarbonate resin, polyester resin, epoxy resin, silicone resin, fluorine resin, etc.), but is not limited thereto.

A first interlayer insulating layer ILD1 may be disposed on the substrate SUB. The channel layer 110 may be disposed on the first interlayer insulating layer ILD1. As an example, the channel layer 110 may be provided in the form of an ultra-thin film. The channel layer 110 may be the 2D material layer 11 described above.

The source electrode 120 and the drain electrode 130 may be disposed on the channel layer 110 while being separated from each other. The source electrode 120 and the drain electrode 130 may be disposed on the same surface of the channel layer 110. The source electrode 120 and the drain electrode 130 may include an electrically conductive material. For example, at least one of the source electrode 120 and the drain electrode 130 may be the metal islands 12 and the metal layer 13 described above.

The gate electrode 140 may be disposed on the channel layer 110 between the source electrode 120 and the drain electrode 130. The gate electrode 140, the source electrode 120, and the drain electrode 130 may be disposed on the same surface of the channel layer 110. According to an embodiment, the gate electrode 140 may include an electrically conductive material. For example, the gate electrode 140 may include a metal or a metal compound.

The gate insulating layer 150 may be disposed between the channel layer 110 and the gate electrode 140 to electrically disconnect the channel layer 110 and the gate electrode 140. For example, the gate insulating layer 150 may include a ferroelectric material. As an example, the ferroelectric material may include at least one of an oxide ferroelectric material, a polymer ferroelectric material, a fluoride ferroelectric material, such as $BaMgF_4$ (BMF), and/or a ferroelectric material semiconductor.

Figure 9:
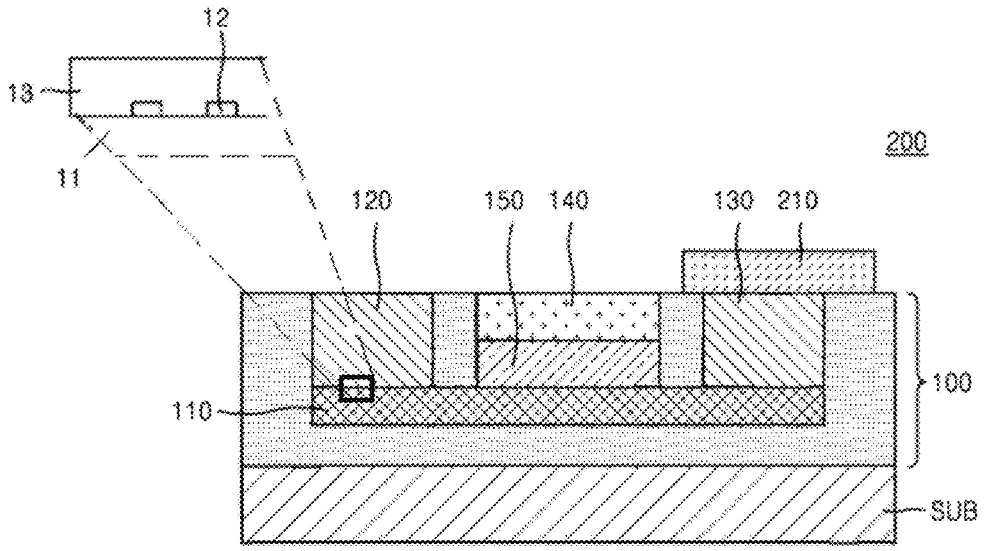
FIG. 9 is a diagram illustrating a memory device using the semiconductor device described above as a switching device and including a data storage device connected to the switching device.

FIG. 9 is a diagram illustrating a memory device 200 using the semiconductor device 100 described above as a switching device and including a data storage element 210 connected to the switching device.

Referring to FIG. 9, the memory device 200 includes the data storage element 210 on the interlayer insulating layer ILD. The data storage element 210 may cover the entire upper surface of the drain electrode 130 and may be in direct contact with the upper surface of the drain electrode 130. The data storage element 210 may include a capacitor, a ferroelectric capacitor, and a magnetic tunnel junction (MTJ) cell. The memory device 200 may be a volatile memory device, such as DRAM, or a nonvolatile memory device, such as FRAM, MRAM, or ReRAM depending on the data storage element 210.

Figure 10:
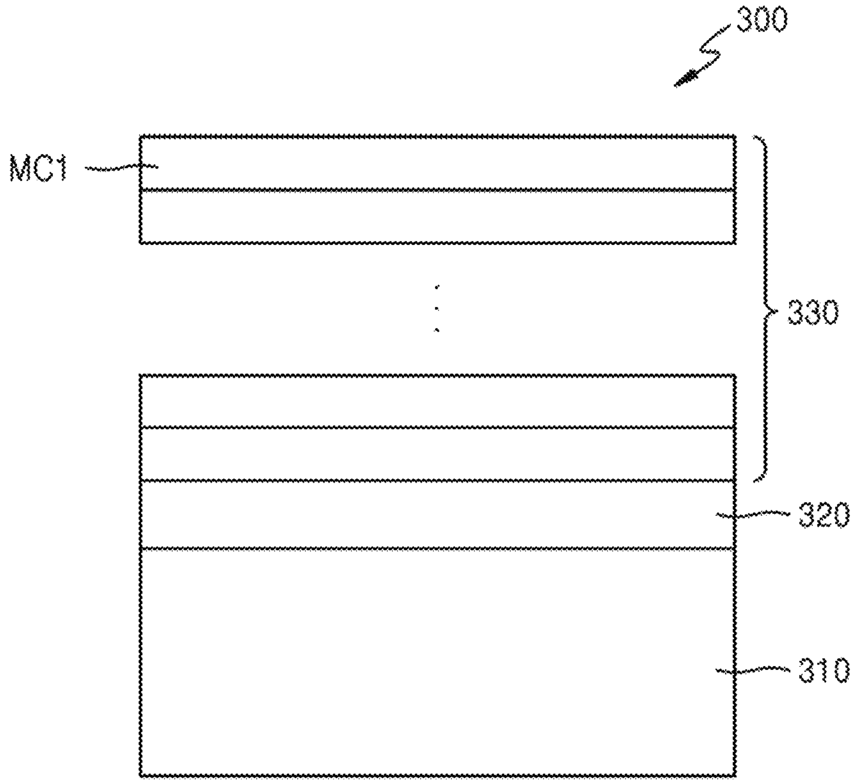
FIG. 10 is a diagram illustrating a memory apparatus in which a plurality of memory cells of FIG. 9 are vertically stacked.

FIG. 10 is a diagram illustrating a memory apparatus 300 in which a plurality of memory cells MC1 of FIG. 9 are vertically stacked.

Referring to FIG. 10, a memory logic layer 320 for controlling an operation of a memory apparatus 400 (see FIG. 11) is disposed on a substrate 310, and a memory cell array 330 is provided on the memory logic layer 320. The memory cell array 330 includes a plurality of vertically stacked memory cells MC1. In one example, each of the memory cells MC1 may be the memory device 200 of FIG. 9.

Figure 11:
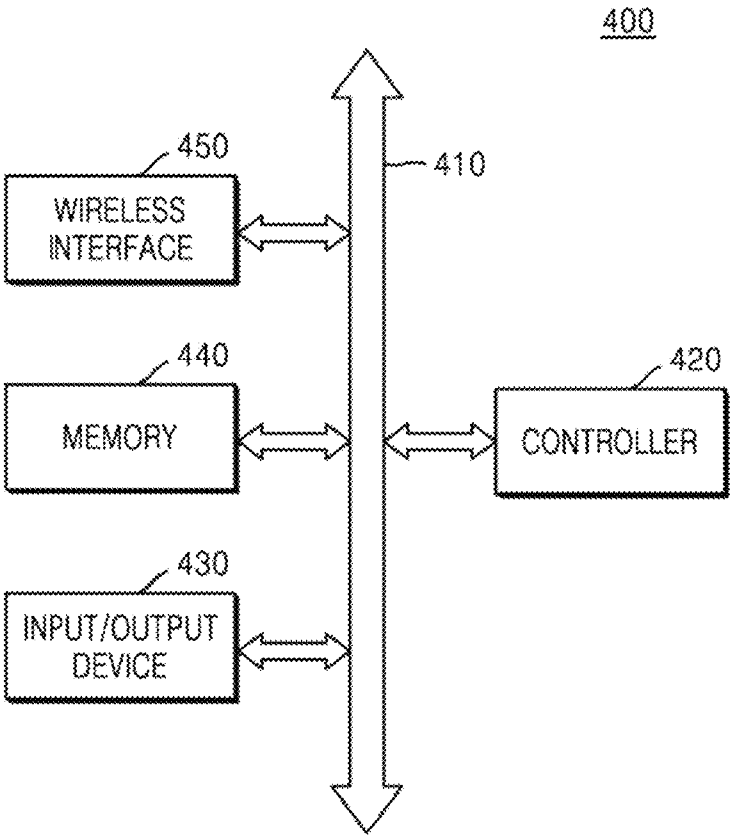
FIG. 11 is a block diagram schematically illustrating an electronic apparatus including a memory device according to an embodiment.

FIG. 11 is a block diagram schematically illustrating an electronic apparatus 400 including a memory apparatus according to an embodiment.

Referring to FIG. 11, the electronic apparatus 400 according to an embodiment may be a PDA, a laptop computer, a portable computer, a web tablet, a wireless phone, a mobile phone, a digital music player, a wired/wireless wireless device, or a composite electronic apparatus including at least two of the above apparatuses. The electronic apparatus 400 may include a controller 420, an input/output device 430, such as a keypad, a keyboard, and a display, a memory 440, and a wireless interface 450 coupled to each other through a bus 410.

The controller 420 may include, for example, at least one of a microprocessor, a digital signal processor, a microcontroller, or a device similar to the devices described above. The memory 440 may be used, for example, to store instructions to be executed by the controller 420.

The memory 440 may be used to store user data. The memory 440 may include a 2D material layer, a metal island, and a metal layer according to an embodiment.

The electronic apparatus 400 may use the wireless interface 450 to transmit data to or receive data from a wireless communication network that communicates using an RF signal. For example, the wireless interface 450 may include an antenna, a wireless transceiver, and the like. The electronic apparatus 400 may be used in a communication interface protocol, such as a 3G communication system, such as Code Division Multiple Access (CDMA), Global System for Mobiles (GSM), north American Digital Cellular (NADC), Expansion Time-Division Multiple-Access (E-TDMA), Wideband Code Division Multiple Access (WCDMA), or CDMA2000.

Figure 12:
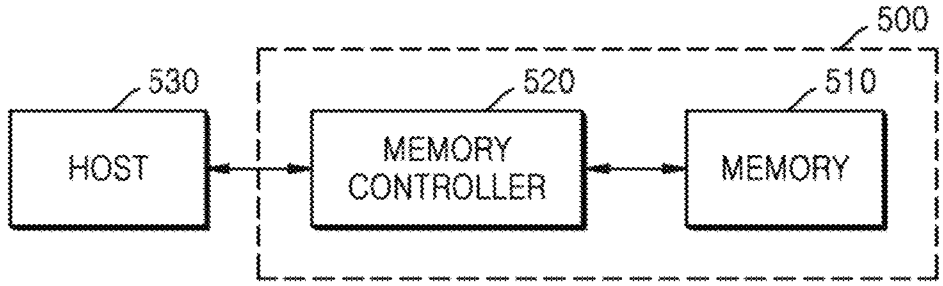
FIG. 12 is a block diagram schematically illustrating a memory system including a volatile memory device according to an embodiment.

FIG. 12 is a block diagram schematically illustrating a memory system 500 including a volatile memory apparatus according to an embodiment.

Referring to FIG. 12, volatile memory devices according to an embodiment may be used to implement the memory system 500. The memory system 500 may include a memory 510 and a memory controller 520 that are configured to store a large amount of data. The memory controller 520 controls the memory 510 to read or write data stored in the memory 510 in response to a read/write request from a host 530. The memory controller 520 may configure an address mapping table for mapping an address provided from the host 530, e.g., a mobile device or a computer system, to a physical address of the memory 510. The memory 510 may include a 2D material layer, metal islands, and a metal layer according to an embodiment.

Figure 13:
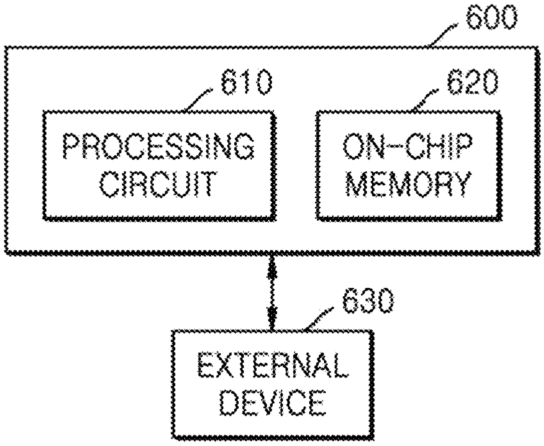
FIG. 13 is a diagram schematically illustrating a neuromorphic device including a memory device according to an embodiment.

The memory apparatus according to embodiments described so far may be implemented in a chip form and used as a neuromorphic computing platform. For example, FIG. 13 is a diagram schematically illustrating a neuromorphic apparatus including a memory apparatus according to an embodiment. Referring to FIG. 13, the neuromorphic apparatus 600 may include a processing circuit 610 and an on-chip memory 620.

The processing circuit 610 may be configured to control functions for driving the neuromorphic device 600. For example, the processing circuit 610 may control the neuromorphic apparatus 600 by executing a program stored in the on-chip memory 620 of the neuromorphic apparatus 600.

The processing circuit 610 may include hardware, such as logic circuitry, a combination of hardware and software, such as a processor that executes software, or a combination thereof. For example, the processor may include a central processing unit (CPU), a graphics processing unit (GPU), an application processor (AP) in the neuromorphic apparatus 600, and an arithmetic logic unit (ALU), a digital processor, a microcomputer, a field programmable gate array (FPGA), a system-on-chip (SoC), a programmable logic unit, a microprocessor, an application-specific integrated circuit (ASIC), etc.

Also, the processing circuit 610 may read and write various data from an external device 630 and execute the neuromorphic apparatus 600 using the data. The external device 630 may include an external memory device and/or a sensor array including an image sensor (e.g., a CMOS image sensor circuit).

The neuromorphic apparatus 600 shown in FIG. 13 may be applied to a machine learning system. The machine learning system may utilize various artificial neural network structures including a recurrent neural network (RNN) that optionally includes, for example, a stacked neural network (SNN), a state-space dynamic neural network (SSDNN), a deep belief network (DBN), a generative adversarial network (GAN), and/or restricted Boltzmann machine (RBM), including a convolutional neural network (CNN), a deconvolutional neural network, a long short-term memory (LSTM), and/or a gated recurrent unit (GRU), and a processing model.

The machine learning systems may include, for example, dimensionality reduction, such as linear regression and/or logistic regression, statistical clustering, Bayesian classification, decision trees, and principal components, and other types of machine learning models, such as expert systems, and/or a combination of these techniques including an ensemble technique, such as random forests. The machine learning model may be used to provide various services, for example, an image classification service, a user authentication service based on biometric information or biometric data, an advanced driver assistance system (ADAS), a voice assistant service, an automatic voice recognition, or an automatic speech recognition service, and may be installed and executed in other electronic apparatuses.

According to an embodiment, because the metal layer is formed on the 2D material layer without receiving external energy, a change in physical properties of the 2D material layer may be reduced. According to an embodiment, because the metal layer is formed after the metal islands are formed on the 2D material layer, a metal layer having a uniform thickness may be obtained. While the thin film structure described above, a method of manufacturing the same, and an apparatus including the thin film structure have been described with reference to the embodiments shown in the drawings, it will be understood by those of ordinary skill in the art that various changes in form and details may be made therein without departing from the spirit and scope of the inventive concept.

While many details are set forth in the foregoing description, it should be construed as illustrative of embodiments, rather than to limit the scope of inventive concepts.

Therefore, the scope of embodiments of inventive concepts should not be limited by the described embodiments, but should be defined by the claims.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of inventive concepts as defined by the following claims.

What is claimed is:

1. A semiconductor device comprising:
a two-dimensional material layer;
a plurality of metal islands spaced apart from each other on the two-dimensional material layer; and
a metal layer covering the plurality of metal islands on the two-dimensional material layer and being in contact with the two-dimensional material layer, wherein the plurality of metal islands and the metal layer include different metals from each other.

2. The semiconductor device of claim 1, wherein a thickness of the metal layer is greater than a thickness of the plurality of metal islands.

3. The semiconductor device of claim 1, wherein a thickness of the metal layer is three or more times a thickness of the plurality of metal islands.

4. The semiconductor device of claim 1, wherein a metal included in at least one of the plurality of metal islands and the metal layer includes a transition metal.

5. The semiconductor device of claim 1, wherein the plurality of metal islands include palladium.

6. The semiconductor device of claim 1, wherein the metal layer includes at least one of gold, silver, copper, platinum, palladium, nickel, chromium, and cobalt.

7. The semiconductor device of claim 1, wherein the metal layer further includes at least one of a non-metal material and a semi-metal.

8. The semiconductor device of claim 7, wherein a ratio of the non-metal material or the semi-metal with respect to the metal layer is greater than 0 at % and less than or equal to 25 at %.

9. The semiconductor device of claim 7, wherein the metal layer further includes at least one of boron and phosphorus.

10. The semiconductor device of claim 1, wherein the two-dimensional material layer includes a transition metal dichalcogenide (TMD).

11. The semiconductor device of claim 10, wherein
the TMD includes a metal element and a chalcogen element,
the metal element includes one of Mo, W, Nb, V, Ta, Ti, Zr, Hf, Tc, Re, Cu, Ga, In, Sn, Ge and Pb, and
the chalcogen element includes one of S, Se and Te.

12. The semiconductor device of claim 1, wherein
the plurality of metal islands are metal particles, and
at least two of the plurality of metal islands are separated from each other.

13. The semiconductor device of claim 1, wherein
a content of the plurality of metal islands with respect to the metal layer is greater than or equal to 0.01 at % and less than or equal to 15 at %.

14. The semiconductor device of claim 1, wherein
the plurality of metal islands form a catalyst layer having a thickness of 10 nm or less.

15. The semiconductor device of claim 1, wherein
the plurality of metal islands are directly on the two-dimensional material layer,
the metal layer directly covers the plurality of metal islands, and
the plurality of metal islands are configured to reduce a number of defects in the two-dimensional material layer.

16. A transistor comprising:
a two-dimensional material layer as a channel layer;
a plurality of metal islands spaced apart from each other on the two-dimensional material layer;
a metal layer covering the plurality of metal islands on the two-dimensional material layer and being in contact with the two-dimensional material layer,
wherein the plurality of metal islands and the metal layer include different metals from each other, and
the plurality of metal islands and the metal layer are a source electrode or a drain electrode of the transistor.

* * * * *